(12) United States Patent
Rengarajan et al.

(10) Patent No.: US 6,936,842 B2
(45) Date of Patent: Aug. 30, 2005

(54) METHOD AND APPARATUS FOR PROCESS MONITORING

(75) Inventors: Suraj Rengarajan, San Jose, CA (US); Michael Wood, San Jose, CA (US); Haojiang Li, Saratoga, CA (US); Moshe Sarfaty, Cupertino, CA (US); Kevin Song, Gardena, CA (US)

(73) Assignee: Applied Materials, Inc., Santa Clara, CA (US)

( * ) Notice: Subject to any disclaimer, the term of this patent is extended or adjusted under 35 U.S.C. 154(b) by 291 days.

(21) Appl. No.: 10/186,270

(22) Filed: Jun. 26, 2002

(65) Prior Publication Data

US 2003/0032207 A1 Feb. 13, 2003

Related U.S. Application Data

(60) Provisional application No. 60/301,179, filed on Jun. 27, 2001.

(51) Int. Cl.[7] .............................................. H01L 23/58
(52) U.S. Cl. ...................................................... 257/48
(58) Field of Search ................................ 118/723, 719; 257/48; 427/248.9

(56) References Cited

U.S. PATENT DOCUMENTS 6,182,602 B1 * 2/2001 Redeker ...................... 118/723
6,413,867 B1    7/2002 Sarfaty et al. .............. 438/689

* cited by examiner

*Primary Examiner*—John F. Niebling
*Assistant Examiner*—Andre' Stevenson
(74) *Attorney, Agent, or Firm*—Moser, Patterson & Sheridan, LLP

(57) ABSTRACT

Embodiments of the invention provide an apparatus and method to determine the health of a substrate process such as, for example, a pre-clean process using plasma to remove copper oxide from a copper layer on a substrate, and the point at which the process has ended. In one aspect, optical characteristics and/or chamber impedance are used to determine the process end-point and/or process chamber health.

11 Claims, 5 Drawing Sheets

METHOD AND APPARATUS FOR PROCESS MONITORING

The application claims benefit of provisional application Ser. No. 60/301,179 filed on Jun. 27, 2001.

BACKGROUND OF THE INVENTION

1. Field of the Invention

The invention generally relates to a method and apparatus for substrate process monitoring.

2. Background of the Related Art

Semiconductor processing generally involves the deposition and removal ("etching") of materials, such as conductors, semi-conductors, and insulators, onto or from substrates to form integrated circuits and other electronic devices. Typical processes include chemical vapor deposition (CVD), physical vapor deposition (PVD), electroplating, chemical mechanical planarization (CMP), etching, and others.

During the processing and handling of substrates, the substrates undergo various structural and chemical changes. Unfortunately, some changes result in contamination, such as the formation of unwanted oxide layers from the reaction of a metallic layer with oxygen. In order to achieve proper device performance, it is important that each layer of material is deposited on, or removed therefrom, a surface substantially free of contamination. For example, failure to provide clean device interconnects having features such as contacts, vias, trenches, and the like, free of contamination, can cause faulty connections and/or increase the resistance of the features, degrading device performance.

One method to clean the surface of a substrate of contamination is a pre-clean process. For pre-clean processing, substrates within a chamber are exposed to a process that cleans the substrate surface of the unwanted impurities such as copper oxides, aluminum oxides, tantalum oxides, and tungsten oxides, and the like, before the next deposition process. One example of a pre-clean process is a reactive pre-clean process used to reduce contamination before the deposition of a subsequent layer of metallization. As one example, a substrate surface contaminated with a copper oxide (CuO) contaminate can be cleaned by exposing the contaminated surface of the substrate to plasma containing hydrogen molecules and helium atoms to chemically reduce the copper oxide contaminate. One method to form the plasma is to flow at least one process gas containing hydrogen and/or helium into a chamber, while maintaining the gas under a desired pressure, and exciting the gas with a power source such as an RF generator using electrodes within the chamber. The plasma dissociates the hydrogen molecules into ions and radicals. The hydrogen ions and radicals diffuse to the contaminated substrate surface where the copper oxide reduction takes place. The reduction of the copper oxide contaminates forms bi-products of water and metallic copper. Generally, the water is removed by the pre-clean processing system through a vacuum pump system adapted to remove water.

One conventional method to ensure that the process is operating within normal parameters requires the periodic insertion of one or more test substrates having a controlled amount of contaminates, such as copper oxides, into the pre-clean chamber for cleaning and analysis. Once cleaned, the test substrates are inspected using external inspection systems. If the test substrates are cleaned within acceptable limits, the chamber is deemed suitable for the pre-clean process.

Unfortunately, production flow is effectively disrupted during the transfer, processing, and external inspection of the test substrates. Consequently, conventional external substrate inspection systems may drastically increase overhead time associated with chip manufacturing. Further, the process may degrade to an unacceptable level before the next inspection, that may allow contaminated substrates to be incompletely processed, resulting in fabrication of defective devices. Still further, contamination problems are compounded in cases where the substrates are re-distributed from a given batch making it difficult to trace back to the contaminating source. Another disadvantage with conventional external substrate inspection systems is the prohibitive cost of the systems. Conventional external substrate inspection systems are typically expensive stand-alone platforms that occupy clean-room space. Because of the large area, or "footprint", required by the stand-alone inspection platforms, the cost of owning and operating such systems is high. A preferred processing system would include an integrated, or embedded, device capable of continuously monitoring the status of the process and facilitate automatic corrective action. Thus, the processing system could be further integrated and throughput can be increased.

Therefore, there is a need for an integrated in situ substrate inspection system capable of monitoring substrate pre-clean processing and determining one or more conditions of the processing in order to detect process anomalies, endpoints, and facilitate a subsequent pre-clean chamber calibration and/or repair decision.

SUMMARY OF THE INVENTION

Aspects of the invention generally provide an apparatus and method for process inspection to determine the endpoint of a pre-clean process as well as the viability of the pre-clean processing chamber. In one embodiment, a substrate process inspection apparatus includes a chamber having a chamber body and a lid defining a cavity, where the lid defines at least one port located to provide a field of view to a plasma within the chamber through an optical energy transmissive window sealably disposed on the port. The apparatus further includes at least one receiver adapted to receive signals from the plasma through the port. The apparatus also includes an RF generator coupled through an RF transmissive path to the chamber including at least one RF power measuring system coupled to the RF transmissive path to detect and measure RF power being delivered within the chamber defining the condition of the process, and a processing system that is coupled to the receiver and the RF power measurement system. The processing system includes one or more computer-readable programs adapted to generate information pertaining to the condition of the process where the condition of the process is compared to at least one signal characteristic and at least one RF power measurement value.

In another aspect of the invention a method is provided for determining a process condition including providing a process gas within the chamber, providing RF energy within the chamber, striking a plasma of the process gas, receiving, at a receiver, at least a portion of a signal comprising a spectrum of wavelengths from the plasma contained within the chamber, generating, at a processing system, a signal value for the signal, determining a process condition by comparing the signal value to at least one reference signal value wherein the receiver is adapted to receive the signals that are between the wavelengths of about 200 nm to about 800 nm.

In one aspect of the invention a method is provided for determining a process condition, including providing RF energy to the chamber with an RF generator coupled to the chamber, receiving, at a receiver, at least a portion of the RF energy transferred within the chamber, determining, at a processing system, the power transfer between an RF generator and the chamber defining a chamber impedance, and determining, at the processing system, a process condition by comparing the chamber impedance value to a reference impedance value.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Aspects of the invention generally provide an apparatus and method for process inspection to determine the endpoint of a pre-clean process as well as the viability of the pre-clean processing chamber. Embodiments of the invention have particular advantages in a multi-chamber processing system (e.g., a cluster tool). One exemplary multi-chamber processing system commonly used in the semiconductor industry, well suited for supporting the detection apparatus described herein, is known as a cluster tool. A cluster tool is a modular system comprising multiple chambers, which perform various functions including substrate pre-clean, metallization, deposition, and/or etching, and the like. In one embodiment, the chambers are mounted to a single transfer chamber, or pair of transfer chambers, that house robots adapted to shuttle substrates between the various process chambers. The transfer chambers are typically maintained at a vacuum condition, and provide an intermediate stage for shuttling substrates from one chamber to another and/or to load lock chambers positioned at a front end of the cluster tool.

Figure 1:
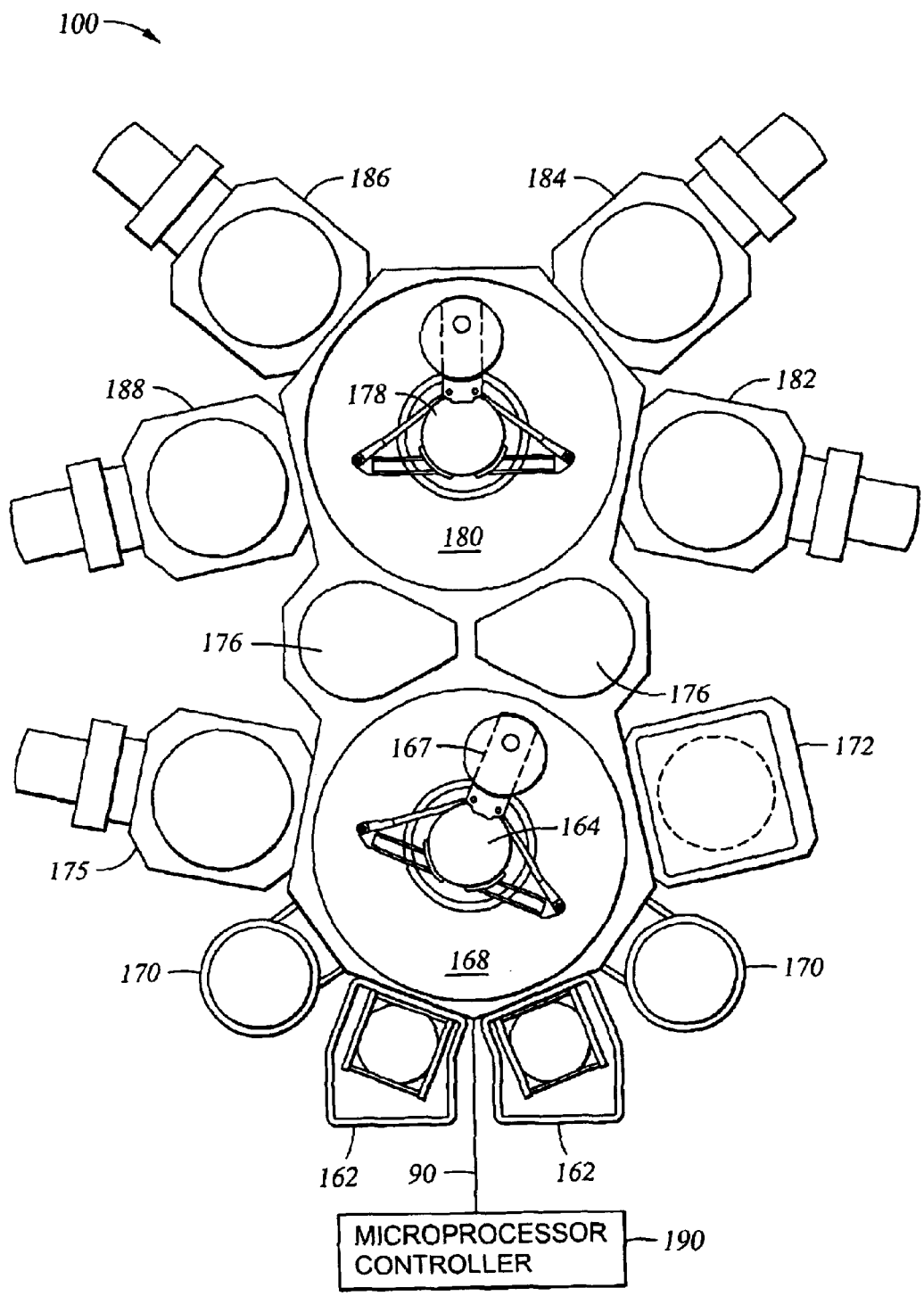
FIG. 1 is a plan view of a typical processing system for semiconductor processing wherein the present invention may be used to advantage.

FIG. 1 is a plan view of a typical processing system 100 for semiconductor processing which the present invention may be used to advantage. The details of one such staged-vacuum substrate processing system is disclosed in U.S. Pat. No. 5,186,718, entitled "Staged-Vacuum Wafer Processing System and Method," Tepman et al., issued on Feb. 16, 1993, which is hereby incorporated by reference in its entirety. The exact arrangement and combination of chambers may be altered for purposes of performing specific steps of a fabrication process.

In accordance with one embodiment incorporating aspects of the invention, the processing system 100 generally comprises a plurality of chambers and robots and is preferably equipped with a processing system controller 190 programmed to carry out the various processing and process inspection methods performed in the processing system 100. Typically, the substrates are introduced and withdrawn from the processing system 100 through cassette load locks 162. A first robot 164 having a blade 167 is located within the processing system 100 to move the substrates through the system 100. The first robot 164 is typically positioned in a buffer chamber 168 to transfer substrates between the cassette load locks 162, degas substrate orientation chamber 170, reactive pre-clean chamber 172, process chamber 175, and cooldown chambers 176. A second robot 178 is located in transfer chamber 180 to transfer substrates to and from the cooldown chambers 176 and the process chambers 182–188. Illustratively, a substrate processed in the processing system 100 is passed from the cassette load locks 162 to the buffer chamber 168 where the first robot 164 moves the substrate between the degas chambers 170, the pre-clean chamber 172, process chamber 175, and the cooldown chambers 176. The second robot 178 typically moves the substrate into and between one or more processing chambers 182–188 before moving the substrate back to the cooldown chambers 176. The substrate is removed from the processing system 100, following processing, through the buffer chamber 168 and then to the load locks 162. The details of one pre-clean process and associated hardware is disclosed in is disclosed in U.S. Pat. No. 6,107,192, entitled "Reactive Preclean Prior to Metallization for Sub-Quarter Micron Application," Suchitra et al., issued on Aug. 22, 2000, which is hereby incorporated by reference in its entirety.

Figure 2:
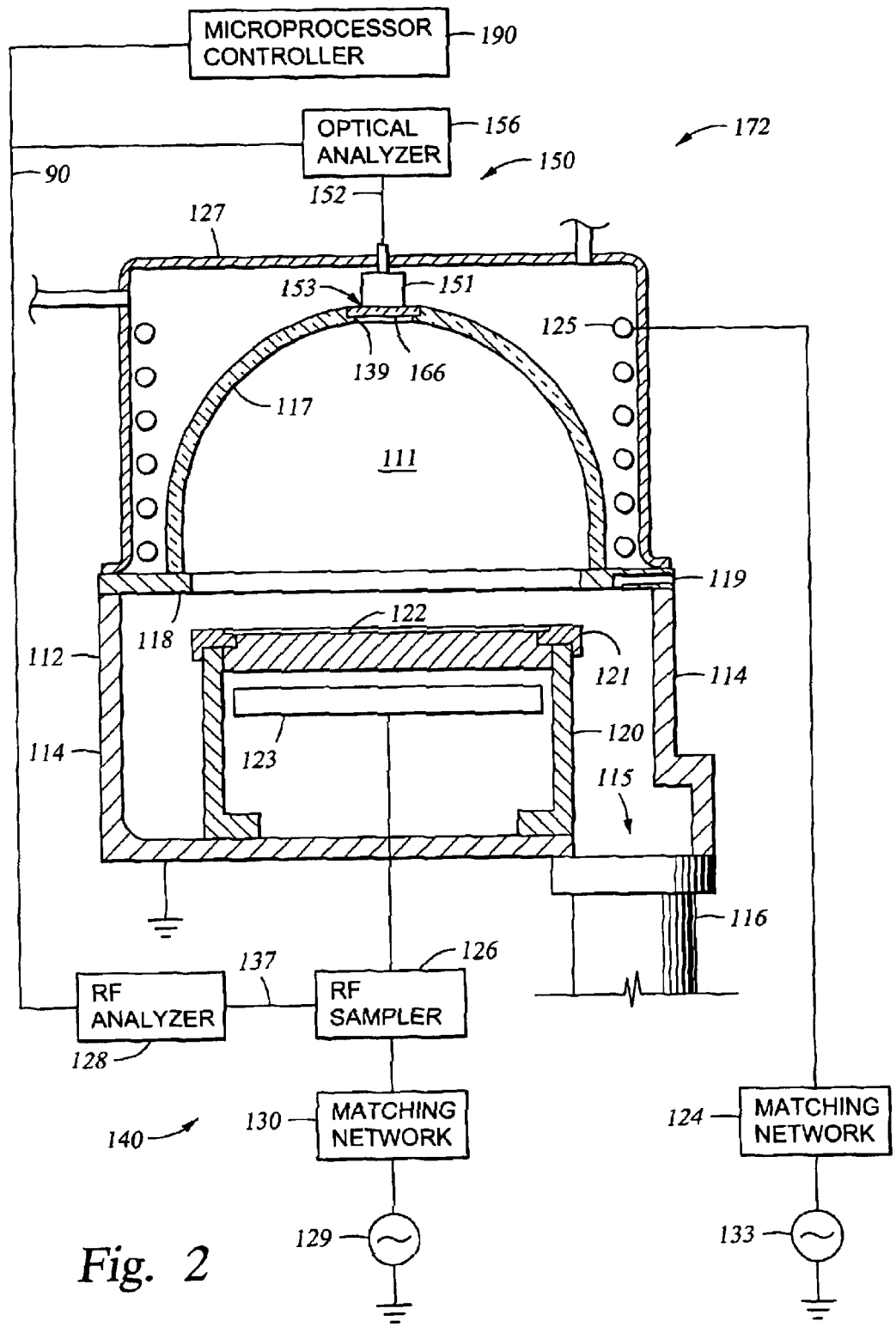
FIG. 2 is a cross sectional view of a chamber and a lid assembly illustrating one embodiment of a process inspection system.

FIG. 2 is a cross sectional view of a pre-clean chamber 172 illustrating one embodiment of a process inspection system. The processing chamber may be a Preclean II chamber which is available from Applied Materials, Santa Clara, Calif. A vacuum chamber 111 is formed by a body member 112 having sidewalls 114 which are made of metallic construction such as stainless steel, aluminum, and the like, adapted to withstand the process environment. The base of the body member 112 includes an opening 115 connected to a vacuum pump 116 that is used to control the gas pressure inside the chamber 111 and remove water by-products of the pre-clean process. A dome 117 forms the top of the chamber 111. The dome 117 is provided with a flange 118 about its circumference where it mates the top circumference of the sidewalls 114 of the base member 112. The dome 117 includes an RF energy transmissive materials such as quartz, glass, ceramics, and the like, adapted to contain plasma within the chamber 111. A gas distribution system 119 is provided at the juncture of the dome 117 and the sidewall 114. The gas distribution system 119 includes a plurality of holes, gas inlets, gas jets, and the like adapted to distribute process gases within the chamber 111. An insulating pedestal 120 comprising insulating materials such as quartz, glass, ceramics, and the like is disposed within the chamber 111. The insulated pedestal 120 includes an insulating cover ring 121 holding a conductive pedestal 122 to the insulated pedestal 120. The conductive pedestal 122 is adapted to hold a substrate within chamber 111 for processing. The cover ring 121 may be secured to the insulated pedestal using conventional fasteners such as screws, bolts, clips, and the like.

To transmit RF energy into the chamber 111, a helical shaped RF induction coil 125 is wound externally around the dome 117 and is supported by a cover 127 using conventional fasteners such as screws, bolts, clips, and the like. The coil 125 is formed of metallic material such as copper, adapted to efficiently transmit RF energy within the chamber 111. An alternating axial electromagnetic field is produced in the chamber 111 interiorly to the windings of the coil 125. RF energy is transmitted from an RF generator 133 through a matching network 124 to the coil 125. Although, in some embodiments, a RF frequency range of about 1.95 mHz to about 2.15 mHz is used to generate plasma of the process gas within chamber 111, other RF frequency ranges are contemplated. The matching network 124 is adapted to match the RF generator 133 to the impedance of the chamber 111 for efficient RF energy transmission. The RF generator 133 may be any output impedance suitable for the transmission of RF energy. For example, the RF generator may have an output impedance of about 50 ohms for a 50 ohm system. In addition, a bias RF generator 129 is capacitively coupled through a bias matching network 130 to the conductive pedestal 122 by a coupling plate 123 to supply a negative bias to the conductive pedestal 122.

In another embodiment, an RF sampler 126 comprising an output port 137 is coupled between the matching network 130 and the coupling plate 123 to sample the bias RF power being delivered to the conducting pedestal 122. The RF sampler 126 may be any RF sampling apparatus such as a coupler, detector, mixer, and the like, adapted to sample the bias RF power being delivered to the conductive pedestal 122. In one aspect, the RF sampler 126 includes an RF coupler having a coupling factor of about 0 dB to about −30 dB and is adapted to have an output power through port 137 of between about 0 dBm to about −20 dBm. In another aspect, the RF sampler 126 is an RF diode detector having a coupling factor of about 0 dB to about −30 dB and an output power through port 137 of between about 0 dBm to about −20 dBm. Even though the RF sampler 126 is shown as a separate device, it is contemplated that the RF sampler 126 may be integral to the matching network 130 or the RF bias generator 129. Accordingly, the RF sampler 126, matching network 130, and RF bias generator 129, may be combined into a single RF bias and sampling apparatus. An RF analyzer 128, such as a power meter, spectrum analyzer, network analyzer, and the like, is coupled to the output port 137 to receive the sampled RF bias power for analysis for a power delivery condition such as chamber impedance. Although the output power of output port 137 is typically between 0 dBm to about −20 dBm, it is contemplated that the output power may be amplified, attenuated, and/or conditioned to any level acceptable to the RF analyzer 128. In one aspect, the RF sampler 126 and RF analyzer 128 define an RF inspection system (RFIS) 140 used to measure and determine the chamber impedance.

Generally, the chamber impedance is a function of the impedance of the plasma and the inductive and capacitive reactance within the chamber 111. The impedance within the chamber 111 can fluctuate from ohms to meg-ohms depending on factors such as plasma composition, plasma density, and the like. In one aspect, the chamber impedance is measured using the RFIS 140 during the pre-clean processing of a test copper substrate having known oxide contaminate amounts. The test copper substrate is inserted into the pre-clean chamber and processed as a normal substrate. During the pre-clean processing of the test copper substrate, the impedance values of the chamber 111 are measured. At least one measured value of the chamber impedance is stored as reference value. Subsequent pre-clean processes may be monitored until the measured chamber impedance value has reached an acceptable point with respect to the at least one reference value. For example, consider the case where at an acceptable end of the pre-clean process, the reference value has been determined to be about 50 ohms. Subsequent substrate pre-clean processes are then compared to the reference value to determine the pre-clean process endpoint. Ideally, the acceptable measured endpoint of the pre-clean process would match the reference value of 50 ohms, however, the desired deviation from the reference value(s) to establish the pre-clean process endpoint may be any acceptable value(s). In one aspect, during a pre-clean process, when the measured chamber impedance is less than about 10 percent of the reference value, the end-point of the process has been reached.

In another embodiment, the voltage, or current used to tune the match of the bias matching network 130 (i.e., the matching network voltage or current) to match the bias RF generator 129 to the chamber impedance is used to determine the pre-clean process endpoint. The bias matching network voltage or current may be measured using measurement devices such as voltmeters, current meters, power meters, and the like. To set a bias matching network voltage or current reference value, the bias matching network voltage or current is measured during the pre-clean process of a test copper substrate having known amounts of contamination. At least one of the bias matching network voltage or current values measured during the pre-clean process of the test copper substrate are stored as a reference value. Subsequent pre-clean processes may be monitored until the bias matching network voltage or current has reached an acceptable point with respect to the at least one reference voltage or current value. For example, consider the case where at an acceptable end of the pre-clean process, the bias matching network voltage reference value has been determined to be about 5 volts. Subsequent pre-clean processes are then compared to the bias network voltage reference value to determine the endpoint. Ideally, at an acceptable endpoint of the pre-clean process, the bias matching network voltage would match the network voltage reference value of 5 volts, however, the desired deviation from the bias network voltage reference value to establish the pre-clean process endpoint may be any acceptable value. In one aspect, when the bias matching network voltage or current value is less than about 10 percent of the bias reference matching network voltage or current value, the process is deemed complete.

In another embodiment, an optical receiver 151 adapted to receive optical signals such as a charge coupled device (CCD), time-domain integration camera (TDI), photo detector, and the like, is coupled to the dome 117 and is in visual contact with the plasma region within the chamber 111. In one aspect, the optical receiver 151 is mounted to a view port 153 and is adapted to receive optical signals between the spectrum of wavelengths of about 200 nm to about 800 nm outputting optical signal values on optical cable 152. The view port 153 includes an opening 139 formed in the dome 117 and is hermetically sealed with an energy transmissive plate 166 made of a material transparent to optical signals from the plasma. In one embodiment, the plate 166 may comprise Quartz Glass™, for example, or any energy transparent medium such as glass, transparent polymers, GaAs, and the like, adapted to allow the transmission of light. The optical receiver 151 is coupled through the optical cable 152 to an optical analyzer 156, such as a spectrometer, adapted to analyze optical signals. In one aspect, the optical sensor 151 and optical analyzer 156 define an imaging inspection system (IIS) 150.

The optical signals emitted from the plasma represent optical characteristics of the plasma within the chamber 111.

The optical characteristics include aspects of the plasma such as density and energy that may be detected by measuring components of light emitted from the plasma such as, spectrum, wavelength, intensity, and the like. Embodiments of the invention have particular applicability with substrates having surface contaminates such as copper oxides, aluminum oxides, tantalum oxides, tungsten oxides, and the like that change the plasma light characteristics where the plasma light contains a spectrum that includes components representing hydroxide (OH), CuO, copper (Cu), and hydrogen (H). Although, the optical characteristics of the plasma can fluctuate dramatically during the process depending on the density, ionic content, and energy of the plasma, the optical characteristics of the plasma due to contaminates, such as CuO, on substrates that undergo a pre-clean process is about consistent for each of same type of substrates processed. In one aspect, the optical characteristics of the plasma are utilized to analyze the status of a pre-clean process to remove oxides from a metallization layer before deposition of an interconnecting metallic layer on a metallic surface of the substrate.

In some embodiments, to monitor the pre-clean process the optical characteristics of the plasma light are measured using the IIS 150 during the pre-clean processing of a test copper substrate having known oxide contaminate amounts. The test copper substrate is inserted into the pre-clean chamber 172 and pre-cleaned as a normal substrate. Once processed, at least one of the optical characteristics of the plasma measured using the test copper substrate is stored as a reference value. Subsequent pre-clean processes may be monitored until the optical characteristics have reached an acceptable point with respect to the reference value(s). For example, during a pre-clean process, if an intensity value of the plasma light, e.g., such as lux, lumens, watts, and the like, at a wavelength, or range of wavelengths, gathered by the IIS 150 represents an acceptably pre-cleaned substrate, then substrates processed where the intensity value of the wavelength(s) of the plasma light are about the same may also be considered acceptably pre-cleaned. Consider the case where the intensity value of pre-clean plasma light at a wavelength of about 300 nm, is considered the reference intensity value for an acceptably pre-cleaned substrate. Then, subsequent pre-cleaned substrates having pre-clean plasma light of about 300 nm with about the same intensity as the reference value(s) may be considered acceptable. In one aspect, when the optical characteristics are less than about 10 percent of the reference value(s), the pre-clean process is deemed acceptable. Similarly, if the test substrate is placed within the chamber 111, the optical characteristics may be measured against the reference value(s) to determine if the chamber is performing within acceptable process limits. By measuring the plasma light intensity at a particular wavelength, or range of wavelengths, gathered by the IIS 150 for the test substrate and comparing them to the reference value(s) obtained for the same or similar substrate the viability of the chamber may be determined. Thus, by measuring the optical characteristic of the plasma during a pre-clean process, the process endpoint and/or pre-clean chamber viability may be determined.

Figure 3:
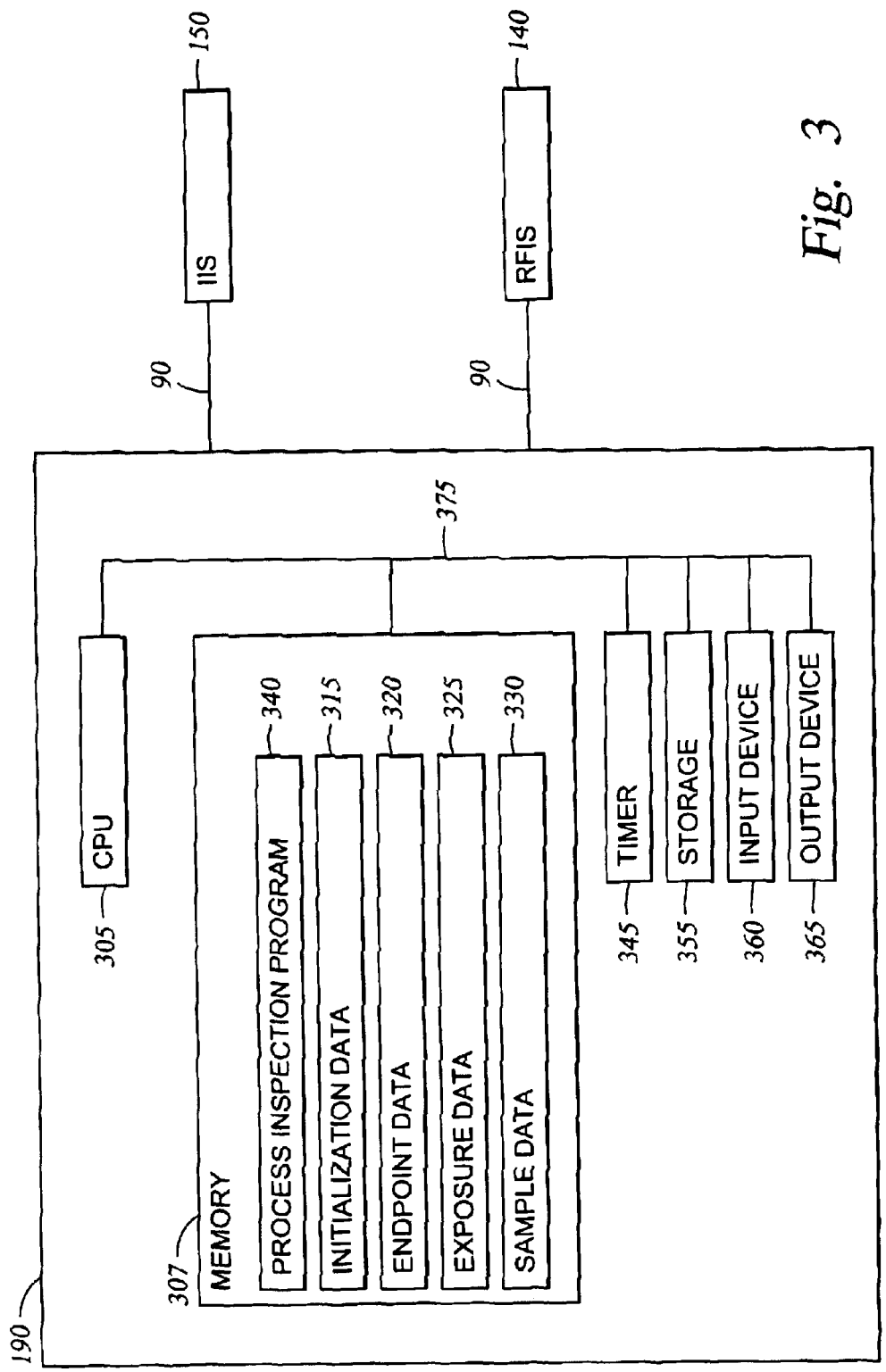
FIG. 3 is a schematic diagram of a controller for use with an embodiment of the process inspection system of the invention.

FIG. 3 is a functional diagram of one embodiment of process controller 190 configured as an inspection processing system controller (IPSC). The IPSC is adapted to receive electrical signal outputs from the optical receiver 151 and/or RF analyzer 128. In general, the IPSC includes a central processing unit (CPU) 305 connected via a bus 375 to a memory 307, storage 355, input device 360, and output device 365. The input device 360 can be any device to give input to the controller 190. For example, a keyboard, keypad, light-pen, touch-screen, track-ball, or speech recognition unit, audio/video player, and the like could be used. The output device 365 is preferably any conventional display screen and, although shown separately from the input device 360, the output device 365 and input device 360 could be combined. For example, a display screen with an integrated touchscreen, and a display with an integrated keyboard, or a speech recognition unit combined with a text speech converter could be used. The IPSC further includes a timer 345 used to set the system time and allow the processor 305 to control the inspection time for the IIS 150. The timer 345 may be run independently or coupled to an external system timer (not shown) to allow for processing system 100 flexibility.

The storage device 355 is preferably a direct access storage device (DASD), although it is shown as a single unit, it could be a combination of fixed and/or removable storage devices, such as fixed disc drives, floppy disc drives, tape drives, removable memory cards, or optical storage. Memory 307 and storage 355 could be part of one virtual address space spanning multiple primary and secondary storage devices.

In one aspect, memory 307 is random access memory sufficiently large to hold the necessary programming and data structures of the invention. The memory 307 contains instructions that the CPU 305 executes to facilitate the performance of the processing system 100. The instructions in the memory 307 are in the form of program code such as a program 400 (see FIG. 4) that implements the method for embodiments of the invention. The program code may conform to any one of a number of different programming languages. For example, the program code can be written in C, C++, BASIC, Pascal, or a number of other languages. While memory 307 is shown as a single entity, it should be understood that memory 307 may in fact comprise a plurality of modules, and that the memory 307 may exist at multiple levels, from high speed registers and caches to lower speed but larger DRAM chips.

Memory 307 further includes a process inspection program (PIP) 340 that, when executed on CPU 305, provides support for the inspection systems IIS 150 and RFIS 140. In one embodiment, the PIP 340 is adapted to (1) control the operation of the IIS 150 and/or the RFIS 140, and (2) receive and process data from the IIS 150 and/or the RFIS 140. Memory 307 also includes various data structures used by the PIP 340. Illustratively, memory 307 is shown containing an initialization data structure 315. The initialization data structure 315 includes instrument initialization data such as the time length of the inspection process, calibration data, measurement rate, and the like, for the IIS 150 and/or RFIS 140. The memory includes a reference process end-point data structure 320, to define the process endpoint, and exposure setting data structure 325, to set the inspection time for the IIS 150 and/or RFIS 140. The data received from the IIS 150 and/or RFIS 140 is placed in sample data structure 330. In one embodiment, the PIP 340 includes a graphical user interface (GUI), which allows the user to display and interact with the inspection data, settings, reference values, and the like through input device 360 and output device 365.

FIG. 3 is merely one hardware configuration of controller 190. Other embodiments of the invention can apply to any comparable hardware configuration, regardless of whether the controller is a complicated, multi-user computing apparatus, a single-user workstation, or network appliance that does not have nonvolatile storage of its own.

Figure 4:
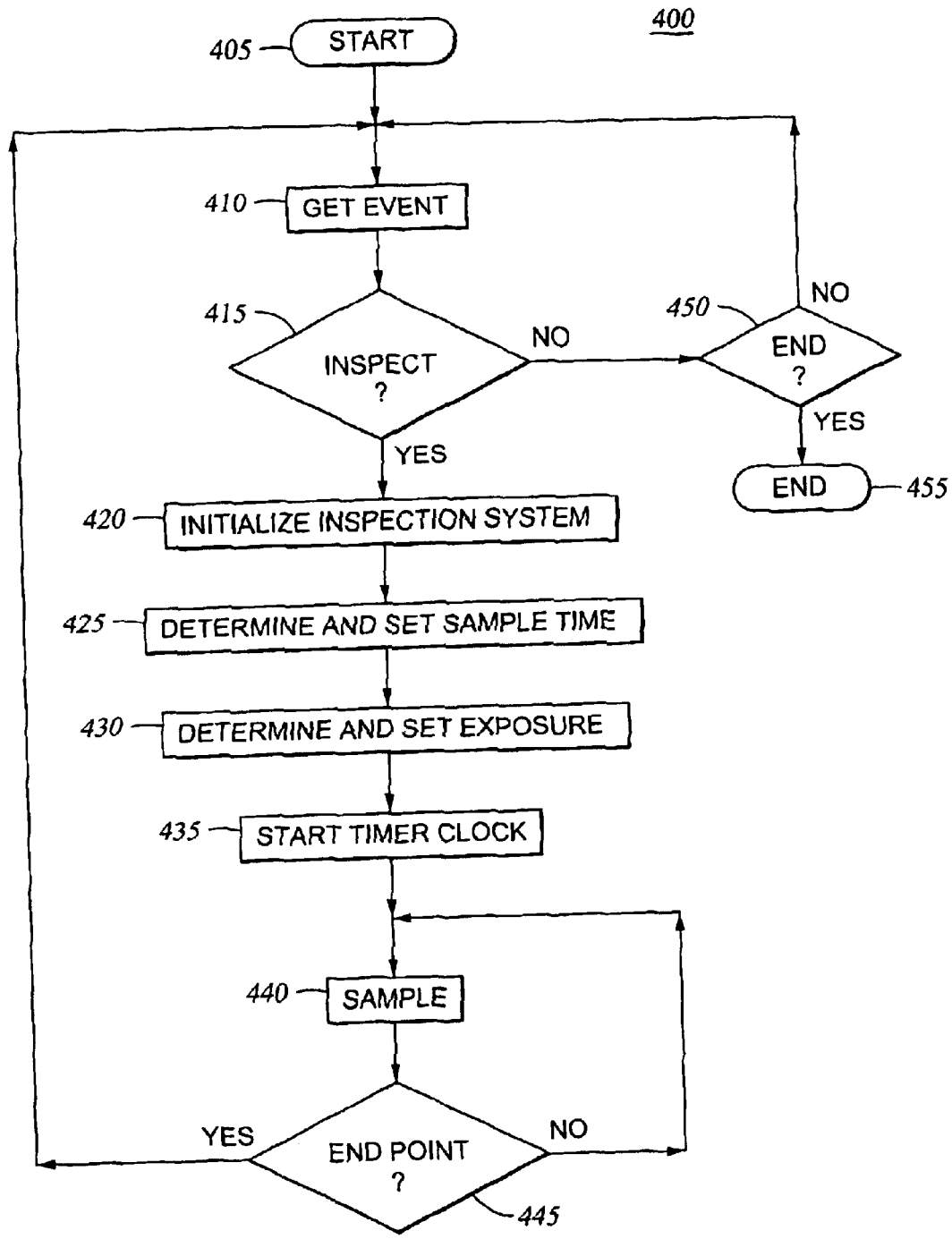
FIG. 4 is a flow diagram of a process inspection method according to an embodiment of the invention.

FIG. 4 is a flow diagram for one embodiment of a method of process inspection using the PIP program 340. The method 400 of FIG. 4 is entered at step 405 when, for example, the process system controller 190 begins the monitoring of a pre-clean process or the viability of the pre-clean chamber 172 to process substrates. Method 400 at step 410 gets an event such as a start-inspection trigger event. Method 400 at step 415 determines whether a start-inspection trigger event has occurred to begin the inspection process. If the event is not a start-inspection trigger event, then method 400 proceeds to step 450. At step 450, the method 400 determines if the event is an end-inspection event. If the event is not an end-inspection event, the method 400 returns to 410 to receive the next event. If the event is an end-inspection event, the method 400 proceeds to step 455 and exits.

For an optical measurement of the optical signals (i.e., light) emitted from the plasma using the IIS 150, if the event is a start-inspection trigger from the process system controller 190, the method 400 proceeds to step 420 to initialize the IIS 150. The IIS 150 subsequently receives a start-inspection trigger signal and initialization data from controller 190 via I/O cable 90. Although, the start-inspection trigger signal may be in electrical form such as TTL, CMOS, and the like, however other types of start-inspection control signals including optical, mechanical, magnetic, and the like, adapted to control the IIS 150 may be used. At step 425, method 400 sets the length of time for the process inspection. At step 430, the exposure time for the IIS 150 is calibrated. The exposure is calibrated so that the process endpoint can be reached and detected without over or under exposure. Illustratively, the exposure time may be identical to the length of time for the process inspection as the IIS 150 is measuring the optical signals from the plasma in realtime so that when the proper optical signal output has been reached, the exposure is also completed. At step 435, the system timer 345 is initialized to allow CPU 305 to determine and control the inspection time. At step 440, the IIS 150 inspects the process according to the allowed length of time for the process inspection. At step 445, method 400 determines if the process has reached the endpoint. To determine the endpoint of the process, method 400 generates information in the form of optical characteristic values representing the characteristics of the optical signals from the IIS 150. The method 400 compares the optical characteristic values to reference endpoint data value(s) from the reference endpoint data structure 320. If the process has reached the desired endpoint value, the method 400 returns to 410 to await the next event. If the process has not reached the desired endpoint, the method 400 returns to step 440.

For a chamber impedance measurement using the RFIS 140, if the event is a start-inspection trigger from the process system controller 190, the method 400 proceeds to step 420 to initialize the RFIS 140. The RFIS 140 subsequently receives a start-inspection trigger signal and initialization data from controller 190 via I/O cable 90. Although, the start-inspection trigger signal may be in electrical form such as TTL, CMOS, and the like, however other types of start-inspection control signals including optical, mechanical, magnetic, and the like, adapted to control the RFIS 140 may be used. At step 425, method 400 sets the measurement length of time for the process inspection. At step 430, the measurement rate for the RFIS 140 is calibrated. The measurement rate is calibrated so that the process endpoint can be reached and detected without over or under measurement. Ideally, the measurement rate of the RFIS 140 is set not so rapid as to over measure the chamber impedance and therefore slow the measurement time but is also set not so slow as to have poor measurement resolution and perhaps exceed the amount of time necessary to complete the pre-clean process. At step 435, the system timer 345 is initialized. At step 440, the RFIS 140 inspects the process according to the time allowed. At step 445, method 400 determines if the process has reached the endpoint. To determine the endpoint of the process, method 400 generates information in the form of chamber impedance values representing the characteristics of the chamber impedance measured by the RFIS 140. The method 400 compares the chamber impedance values to impedance reference endpoint data value(s) from the reference endpoint data structure 320. If the process has reached the desired endpoint value, the method 400 returns to 410 to await the next event. If the process has not reached the desired endpoint, the method 400 returns to step 440. In one aspect, the IIS 150 and the RFIS 140 may be used simultaneously to detect the pre-clean process endpoint. Thus, by comparing the optical characteristic values and/or chamber impedance values to reference endpoint data value(s) from the reference endpoint data structure 320 the status of the pre-clean process may be determined.

An Example of an Optical Inspection to Detect a Pre-Clean Process Endpoint

In operation, the pre-clean chamber 172 receives from the first robot 164 a contaminated substrate that is placed on the conductive pedestal 122. A plurality of different pre-clean process regimes may be performed with the pre-clean chamber 172 tailored to the type substrate and contaminate. For example, for copper oxides a process gas mixture such as about 80% to about 100% of $H_2$ with about 0% to about 20% He, or about 50% to about 100% of $H_2$ and about 0% to about 50% Ar, or about 80% to about 100% of $H_2$ and about 0% to about 20% $N_2$ are flowed into the chamber 111 at a rate of about 0 sccm to about 300 sccm and stabilized at a pressure of between about 0.5–100 mT by vacuum pump 116. A power level of between about 100 W and about 500 W at a frequency range of between about 1.95 mHz to about 2.15 mHz is applied to the coil 125. A bias RF power level of between about 1 W and about 100W at a frequency range of between about 13 mHz to about 14 mHz is applied to the conductive pedestal 122. The substrate is then cleaned of copper oxides whereby the radicals combine with the copper oxides to form OH and $H_2O$ that are subsequently removed from the pre-clean chamber 175 using the vacuum pump 116.

Figure 5:
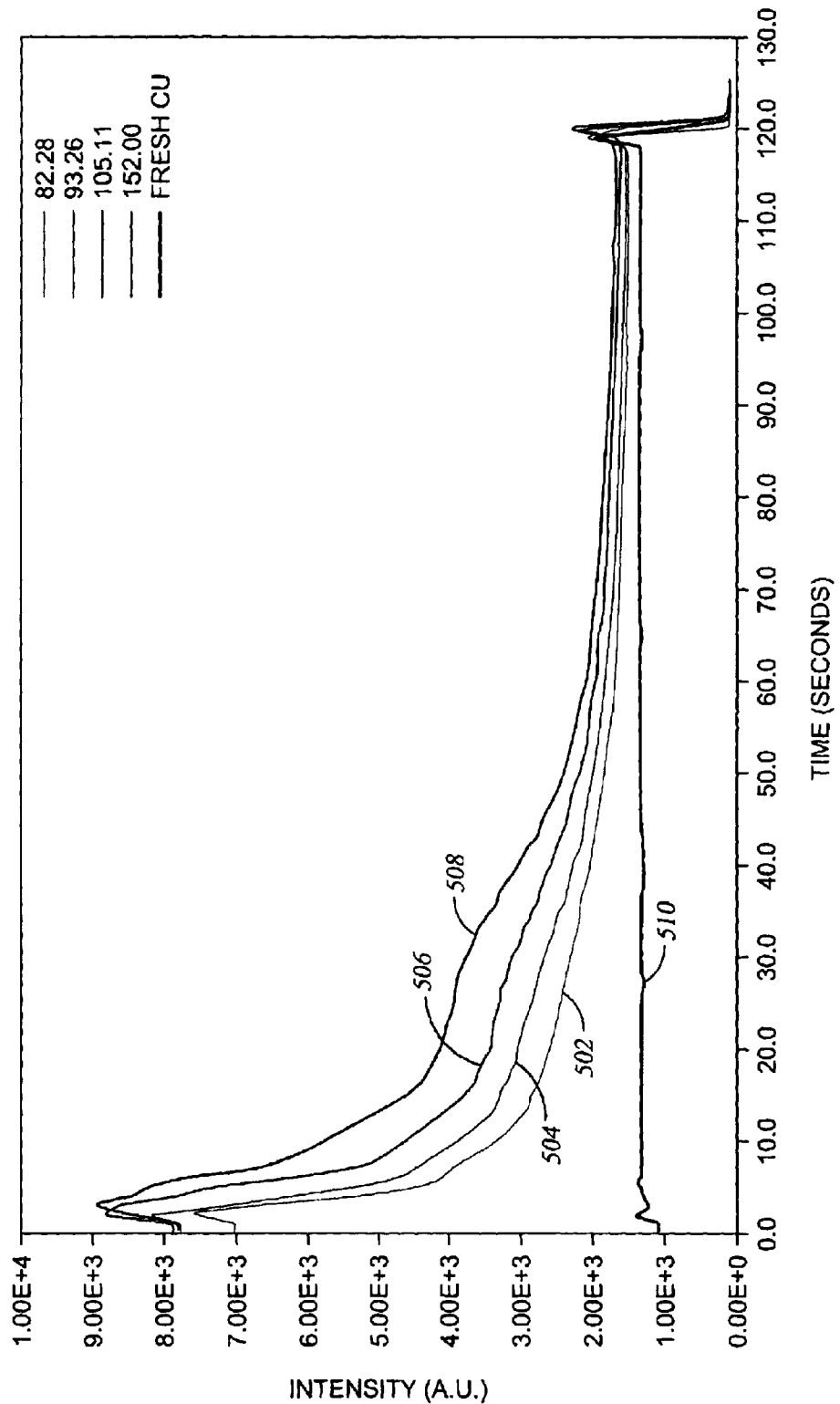
FIG. 5 is a plot illustrating intensity plots for pre-clean times with respect to a reference material.

In one embodiment, regardless of the pre-clean regime used, during an optical inspection of the pre-clean process, the optical characteristics of the plasma light are measured using the IIS 150 in conjunction with the IPSC. FIG. 5 illustrates the results of monitoring one such pre-clean process within a pre-clean chamber 172 by an IPSC coupled to an IIS 150. FIG. 5 represents a substrate pre-clean process image scan showing the optical signal values from an optical receiver 151 adapted to receive optical signals from the plasma that are between the wavelengths of about 300 nm to about 310 nm and measure the optical characteristics of the signals. The process time (x-axis) and readings by the optical analyzer 156, at a particular intensity (y-axis) level are plotted. Subsequently, four different test substrates and a reference copper material were processed in a similar manner resulting in five separate and distinct plots 502–510. To determine the relative amount of contamination, the intensity plot values 502–508 for the four test substrates were compared to the intensity reference plot values 510. In one aspect, the pre-clean process endpoint requirement for the pre-clean process is to remove the copper oxides to a pre-determined level, generally less than about 10% of the intensity reference value 510. A first test layer of copper oxide was deposited on the surface of the test substrate to a thickness of about 152 angstroms. The test substrate was then processed using the pre-clean process. The IIS 150 sampled the process plasma until the intensity plot 508 of the optical signals of the plasma for the optical range of 308+/−2 nm was completed where the copper oxides plot value was within about 5% to about 15% of the intensity value of the copper reference plot 510. A second test layer of copper oxides was deposited on the surface of a second test substrate to a thickness of about 93.26 angstroms. The second test substrate was then processed using the pre-clean process. The IIS 150 sampled the process plasma until the intensity of the optical signals of the plasma for the optical range of 308+/−2 nm was completed where the copper oxides plot value 506 was within about 5% to about 15% of the intensity value of the copper reference 510. A third test layer of copper oxides was deposited on the surface of a third test substrate to a thickness of about 105.11 angstroms. The third test substrate was then processed using the pre-clean process. The IIS 150 sampled the process plasma until the intensity plot 504 of the optical signals of the plasma for the optical range of about 308+/−2 nm was completed where the copper oxides plot value was within about 5% to about 15% of the intensity value of the copper reference 510. A fourth test layer of copper oxides was deposited on the surface of a fourth test substrate to a thickness of about 152 angstroms. The fourth test substrate was then processed using the pre-clean process. The IIS 150 sampled the process plasma until the intensity plot 502 of the optical signals of the plasma for the optical range of about 308+/−2 nm was completed where the copper oxides plot value was within about 5% to about 15% of the intensity value of the copper reference 510. All of the test substrates where processed within the pre-clean chamber to a final acceptable value of between about 5% to about 15% of the intensity value of the copper reference 510 within a time of about 60 seconds to about 90 seconds. Thus, the IIS 150, in conjunction with the IPSC, was able to detect and determine an acceptable endpoint of the pre-clean process for each of the substrates.

While foregoing is directed to the preferred embodiment of the present invention, other and further embodiments of the invention may be devised without departing from the basic scope thereof, and the scope thereof is determined by the claims that follow.

What is claimed is:

1. A substrate process inspection apparatus, comprising:
   a chamber comprising a chamber body and a lid defining a cavity, wherein the lid defines at least one port located to provide a field of view to a plasma region within the chamber;
   an energy transmissive window sealably disposed on the port;
   at least one receiver adapted to receive optical signals from the plasma through the port;
   a RF generator coupled through an RF transmissive path to the chamber;
   at least one RF power measuring system coupled to the RF transmissive path to detect and measure RF power being delivered within the chamber; and
   a processing system including one or more computer-readable programs adapted to generate information pertaining to the condition of the process, wherein for optical signal measurements the condition of the process is compared to at least one optical signal characteristic, and wherein for a power delivery measurement the condition of the process is compared to at least one RF power delivery value and a process controller that comprises a central processing unit, a memory, a timer, a storage, an input device, an output device and a bus.

2. The apparatus of claim 1, wherein the processing system is configured to perform the method of:
   generating information representing the at least one optical signal characteristic; and
   processing the information to derive a status of the process.

3. The apparatus of claim 1, wherein the energy transmissive window material is selected from the group of quartz, glass, GaAs, ceramics, and combinations thereof.

4. The apparatus of claim 1, wherein the RF power measuring system comprises an RF detector.

5. The apparatus of claim 1, wherein the RF power measuring system is adapted to measure the power delivery value defined by at least one chamber impedance value.

6. The apparatus of claim 1, wherein the RF transmissive path comprises a matching network controlled by at least one electrical signal.

7. The apparatus of claim 6, wherein the electrical signal is selected from a voltage, a current, a power, and combinations thereof.

8. A substrate process inspection apparatus, comprising:
   a chamber comprising a chamber body and a lid defining a cavity, wherein the lid defines at least one port located to provide a field of view to a plasma region within the chamber;
   an energy transmissive window sealably disposed on the port;
   at least one receiver adapted to receive signals from the plasma through the port and adapted to receive a spectrum of signals that are between the wavelengths of about 200 nm to about 800 nm;
   a RF generator coupled through an RF transmissive path to the chamber;
   at least one RF power measuring system coupled to the RF transmissive path to detect and measure RF power being delivered within the chamber; and
   a processing system including one or more computer-readable programs adapted to generate information pertaining to the condition of the process, wherein for signal measurements the condition of the process is compared to at least one signal characteristic, and wherein for a power delivery measurement the condition of the process is compared to at least one RF power delivery value.

9. The apparatus of claim 8, wherein the receiver is adapted to receive a spectrum of signals between the wavelengths of about 300 nm to about 310 nm.

10. The apparatus of claim 8, wherein the spectrum of signal wavelengths is selected from the group of signals emitted from the plasma containing OH, CuO, Cu, and H spectrum, and combinations thereof.

11. The apparatus of claim 1, wherein the memory further comprises a process inspection program, an initialization data structure, an endpoint data structure, an exposure data structure and a sample data structure.

* * * * *

UNITED STATES PATENT AND TRADEMARK OFFICE
CERTIFICATE OF CORRECTION

PATENT NO.         : 6,936,842 B2                                                    Page 1 of 1
APPLICATION NO. : 10/186270
DATED              : August 30, 2005
INVENTOR(S)        : Suraj Rengarajan et al.

It is certified that error appears in the above-identified patent and that said Letters Patent is hereby corrected as shown below:

On Title Page, Item 56, Col. 2

References Cited, U.S. PATENT DOCUMENTS: Please include the following references:

5,186,718    2/1993  Tepman et al. ...........................29/25.01
    6,107,192    8/2000  Subrahmanyan et al. ................... 438/637

Item [56], References Cited, OTHER PUBLICATIONS: Please include the following references:

McNevin et al., Bias Voltage Diagnostics During Oxide Etch in Drytek 384T," Proceedings of the 39th National Symposium of the American Vacuum Society, Part 1; Journal of Vacuum Science & Technology A, Second Series, Volume 11, Number 4, Part 1, July/August 1993.

Column 4, Line 29: Delete the first instance of "is disclosed in"

Column 11, Claim 1, Line 60: Change "RE" to --RF--
Column 12, Claim 1, Line 4: Change "RE" to --RF--
Column 12, Claim 1, Line 4: Insert a comma after "value"

Signed and Sealed this

Twenty-eighth Day of November, 2006

JON W. DUDAS
*Director of the United States Patent and Trademark Office*